(12) United States Patent
Kawahara et al.

(10) Patent No.: US 9,419,641 B1
(45) Date of Patent: Aug. 16, 2016

(54) D/A CONVERSION CIRCUIT

(71) Applicant: DENSO CORPORATION, Kariya, Aichi-pref. (JP)

(72) Inventors: Shogo Kawahara, Kariya (JP); Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/994,564

(22) Filed: Jan. 13, 2016

(30) Foreign Application Priority Data

Mar. 3, 2015 (JP) .................................. 2015-41228

(51) Int. Cl.
*H03M 1/66* (2006.01)

(52) U.S. Cl.
CPC ........................................ *H03M 1/66* (2013.01)

(58) Field of Classification Search
CPC ....... H03M 1/001; H03M 1/004; H03M 1/02; H03M 1/66
USPC .................................................. 341/144, 145
See application file for complete search history.

(56) References Cited

U.S. PATENT DOCUMENTS

| | | | |
|---|---|---|---|
| 4,529,897 A | 7/1985 | Suzuki et al. | |
| 5,331,322 A * | 7/1994 | Cha .................. | H03K 17/04106 327/427 |
| 6,359,496 B1 | 3/2002 | Steinhagen | |
| 6,778,120 B2 * | 8/2004 | Matsui .................. | H03M 1/687 341/145 |
| 6,911,858 B2 * | 6/2005 | Mori .................. | H03F 3/45183 327/307 |
| 7,015,846 B2 * | 3/2006 | Lin .......................... | G05F 3/267 326/68 |
| 7,332,941 B2 | 2/2008 | Ishii | |
| 7,372,387 B2 * | 5/2008 | Li .......................... | H03M 1/765 341/144 |
| 7,847,625 B2 | 12/2010 | Roh et al. | |
| 8,427,415 B2 * | 4/2013 | Morita .................. | G09G 3/3688 345/100 |
| 2003/0141998 A1 * | 7/2003 | Matsui .................. | H03M 1/687 341/145 |
| 2015/0070202 A1 * | 3/2015 | Dedic .................. | H03K 17/063 341/144 |

FOREIGN PATENT DOCUMENTS

| | | |
|---|---|---|
| JP | 59-28723 A | 2/1984 |
| JP | 61-193517 A | 8/1986 |
| JP | 2009-260605 A | 11/2009 |

OTHER PUBLICATIONS

Seyfi S. Bazarjani and W. Martin Snelgrove, "Low Voltage SC Circuit Design with Low-Vt MoSFETs", Circuits and Systems, 1995, pp. 1021-1024, IEEE International Symposium (in English).

* cited by examiner

*Primary Examiner* — Jean B Jeanglaude
(74) *Attorney, Agent, or Firm* — Posz Law Group, PLC

(57) ABSTRACT

A D/A converter is configured to output tri-level potentials from an output terminal. A high potential terminal and the output terminal are connected through a p-type MOS transistor. An intermediate potential terminal and the output terminal are connected through p-type and n-type MOS transistors, which are connected in series and have low threshold voltages. A low potential terminal and the output terminal are connected through an n-type MOS transistor. The p-type MOS transistor and the n-type MOS transistor connected to the Intermediate potential terminal have a positive voltage and a negative voltage between gate-source paths in off-states, respectively, and a substrate bias effect and hence remain in the off-state stably.

9 Claims, 4 Drawing Sheets

FIG. 5A
FIG. 5B
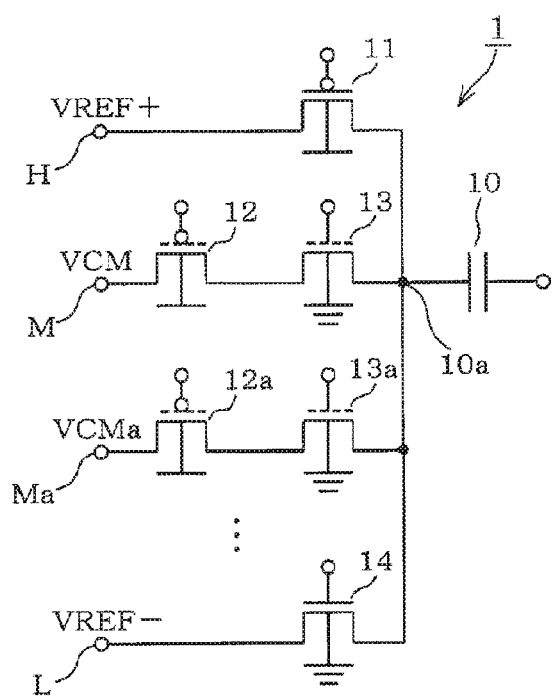
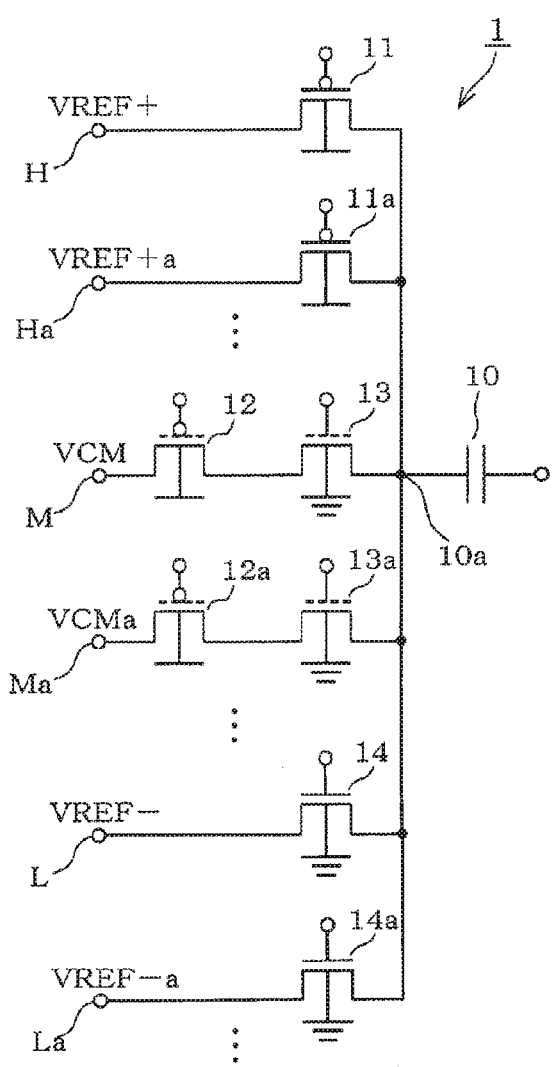

D/A CONVERSION CIRCUIT

CROSS REFERENCE TO RELATED APPLICATION

This application is based on Japanese patent application No. 2015-41228 filed on Mar. 3, 2015, the whole content of which is incorporated herein by reference.

FIELD

The present disclosure relates to a D/A conversion circuit.

BACKGROUND

In an over-sampling type A/D conversion circuit such as a $\Delta\Sigma$-type A/D conversion circuit, which is a semiconductor integrated circuit, a D/A conversion circuit is used to feedback an output. In a tri-level D/A conversion circuit used for this purpose, output potentials VREF−, VCM and VREF+ are set to be 0V, 1.5V and 3.0V, respectively. A MOS transistor is provided at each output part, which outputs a potential to an output terminal through the MOS transistor upon receiving a corresponding control signal.

In a case that this configuration is manufactured in a manufacturing process for a low voltage device, the potential of VCM, which is an output potential, is close to a threshold value including a substrate bias effect of the MOS transistor, when the VCM is outputted as an intermediate potential of the above-described configuration. For this reason, an on-resistance increases. In a case that a MOS transistor of a low threshold voltage is used to avoid the high on-resistance, an off-resistance of the MOS transistor decreases and generates a leak current when a potential of a DAC capacitance at turn-off time becomes close to a potential of a power supply or ground.

For solving the above-described problems, the following patent documents 1, 2 and non-patent document 1 propose counter-measure technologies. However those documents also have other problems.

For example, in patent document 1, a MOS transistor having a normal threshold voltage is used and a potential of a back gate is set to be equal to an input voltage at turn-on time to thereby decrease an on-resistance. According to this configuration, for controlling the back gate, an impedance of a substrate potential increases resulting in less tolerance to noise. Since each MOS transistor need be separated by a well or the like, a circuit area increases.

In patent document 2 and non-patent document 1, for widening an Input and output ranges, a CMOS switch having a normal threshold voltage and a series circuit of n-type and p-type MOS transistors having low threshold voltages are connected in parallel. However, an Intermediate node in the series circuit of the MOS transistors is likely to become floated at turn-off time and generate errors at high speed operation time. Further, in a case of application to a tri-level D/A conversion circuit, a circuit area increases because a MOS transistor need be provided unnecessarily for one level.
[Patent document 1] JP S59-28723 A
[Patent document 2] U.S. Pat. No. 6,359,496
[Non-patent document 1] S. S. Bazarjani and W. M. Snelgrove, "Low Voltage SC Circuit Design with Low Vt MOSFETs," Proc. Of IEEE International Symposium on Circuits and Systems (ISCAS), pp. 1021-1024, May 1995

SUMMARY

It is therefore an object to provide a D/A conversion circuit, which outputs a potential with high precision without increasing the number of circuit elements and a circuit area.

According to one aspect, a D/A conversion circuit comprises a low potential switch, an intermediate potential switch and a high potential switch for selecting one of potentials of a low potential terminal, an intermediate potential terminal and a high potential terminal in response to a control signal, respectively, and outputting a selected potential to an output terminal. The high potential switch includes a first p-type MOS transistor connected between the high potential terminal and the output terminal. The low potential switch includes a first n-type MOS transistor connected between the low potential terminal and the output terminal. The Intermediate potential switch is connected between the Intermediate potential terminal and the output terminal and includes a series circuit of a second p-type MOS transistor, which has a threshold voltage lower than that of the first p-type MOS transistor, and a second n-type MOS transistor, which has a threshold voltage lower than that of the first n-type MOS transistor.

BRIEF DESCRIPTION OF THE DRAWINGS

FIG. 5A and FIG. 5B are electric circuit diagrams showing a third embodiment.

DETAILED DESCRIPTION OF EMBODIMENT

A D/A conversion circuit will be described with reference to embodiments, in which the D/A conversion circuit is used in a configuration of an A/D conversion circuit.

First Embodiment

Figure 1:
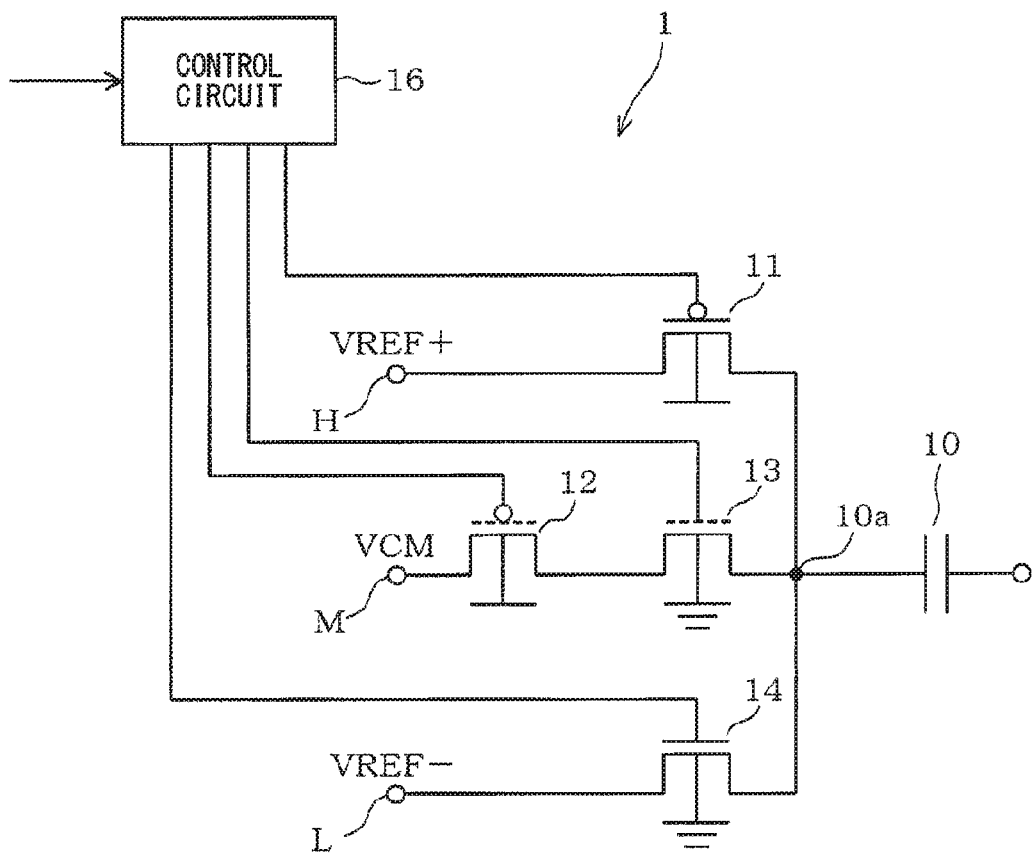
FIG. 1 is an electric circuit diagram showing a first embodiment.
Figure 2:
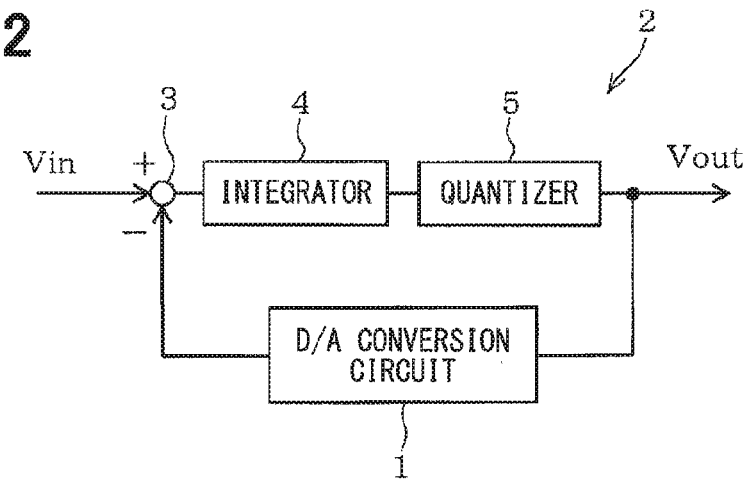
FIG. 2 is an electric circuit diagram of a D/A conversion circuit.

Referring first to FIG. 1 and FIG. 2, a D/A conversion circuit 1 shown in FIG. 1 is used, for example, in a primary delta-sigma ($\Delta\Sigma$)-type A/D conversion circuit 2 as shown in FIG. 2. In this configuration of the A/D conversion circuit 2 shown in FIG. 2, an input signal Vi is inputted as an additive signal to a subtractor 3 and an output signal indicating a subtraction result is inputted to an integrator 4. The integrator 4 is connected to a quantizer 5, an output signal of which is designated as an output Vout. The output signal Vout of the quantizer 5, which is an analog voltage, is inputted as a subtractive signal to the subtractor 3 through the D/A conversion circuit 1.

With the configuration described above, the Input signal Vin, which is an analog voltage, is converted into the output signal Vout by AZ-modulation. The D/A conversion circuit 1 is configured to output analog voltages of three potentials, which are a high potential VREF+, an intermediate potential VCM and a low potential VREF−. The high potential, VREF+, intermediate potential VCM and low potential VREF− are, for example, 3.0V, 1.5V and 0V, respectively. The output potential of the D/A conversion circuit 1 is set by the output signal Vout of the A/D conversion circuit 2.

The D/A conversion circuit 1 is configured as shown in FIG. 1. The D/A conversion circuit 1 is a tri-level D/A conversion circuit having, as three terminals, a high potential terminal H, an intermediate potential terminal M and a low potential terminal L. A high potential power supply VREF+

(3.0V), an Intermediate potential power supply VCM (1.5V) and a low potential power supply VREF− (0V) are connected to the high potential terminal H, the intermediate potential terminal M and the low potential terminal L, respectively. A capacitor 10 is provided as a DAC capacitor at an output terminal 10a.

The high potential terminal H is connected to the output terminal 10a through a p-type MOS transistor 11. The intermediate potential terminal M is connected to the output terminal 10a through a series connection of a p-type MOS transistor 12 of low threshold voltage and an n-type MOS transistor 13 of low threshold voltage. The low potential terminal L is connected to the output terminal 10a through an n-type MOS transistor 14.

Of the MOS transistors 11 to 14, the p-type MOS transistor 11, the n-type MOS transistor 14, the p-type MOS transistor 12 of low threshold voltage and the n-type MOS transistor of low threshold voltage 13 function as a first p-type MOS transistor, a first n-type MOS transistor, a second p-type MOS transistor and a second n-type MOS transistor, respectively. The p-type MOS transistor 11, the n-type MOS transistor 14, the p-type MOS transistor 12 of low threshold voltage and the n-type MOS transistor 13 of low threshold voltage function as a high potential switch, a low potential switch and Intermediate potential switches.

Threshold voltages of the p-type MOS transistor 12 and the n-type MOS transistor 13 are set to be lower than those of the p-type MOS transistor 11 and the n-type MOS transistor 14.

Gate signals are applied from a control circuit 16 to the MOS transistors 11 to 14. The control circuit 16 operates as a gate driver and outputs the gate signals based on the output of the quantizer 5 or a control state. In the D/A conversion circuit 1, the MOS transistors 11 to 14 are controlled to turn on and off as described below in accordance with cases, in which the intermediate potential VCM is to be outputted through the capacitor 10, the high potential VREF+ is to be outputted through the capacitor 10 and the low potential VREF− is to be outputted through the capacitor 10.

It is assumed that the first embodiment is configured to be operable with low voltages. For this reason, the high potential VREF+, the intermediate potential VCM and the low potential VREF− are set to be 3.0V, 1.5V and 0V, respectively. Further the circuit configuration is designed to be manufactured in a low voltage manufacturing process. For this reason, the MOS transistors 12 and 13 of low threshold voltages, which are in an output part of the intermediate potential VCM of 1.5V, are designed to have respective threshold voltages thereby to turn on surely when the intermediate potential VCM is to be outputted.

Figure 3A:
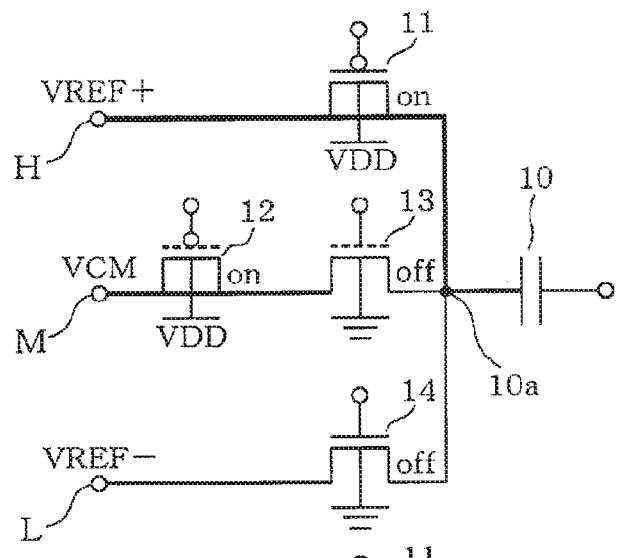
FIG. 3A to FIG. 3C are electric circuit diagrams showing operations.
Figure 3B:
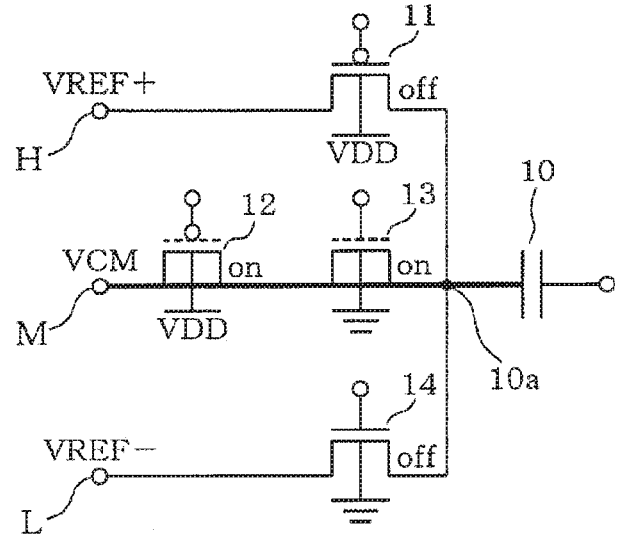
Figure 3C:
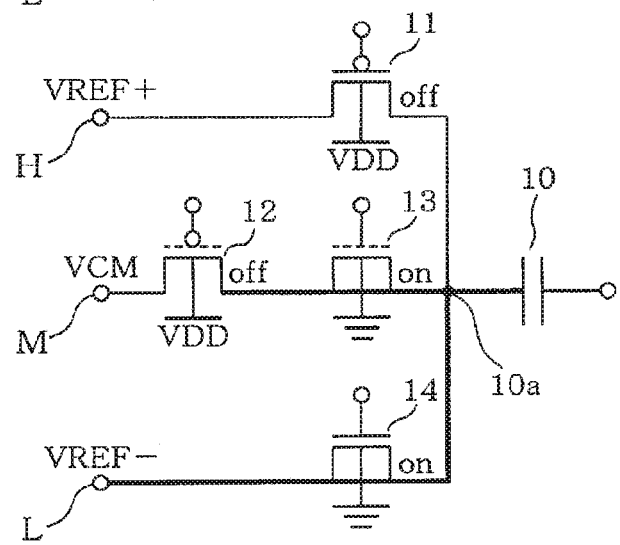

An operation of the above-described configuration will be described with further reference to FIG. 3A to FIG. 3C. The control circuit 16 selectively outputs the output voltages of the D/A conversion circuit 1 in accordance with the output signal or state of the quantizer 5. In FIG. 3A, a bold solid line indicates the conductive state of the same potential. In FIG. 3B and FIG. 3C, bold solid lines indicate the conductive states.

Specifically, the control circuit 16 controls the D/A conversion circuit 1 as shown in FIG. 3A, when the high potential VREF+ is to be outputted. That is, the control circuit 16 turns on the p-type MOS transistor 11 and the p-type MOS transistor 12 of low threshold voltage to the on-states and maintains the n-type MOS transistor 14 and the n-type MOS transistor 13 of low threshold voltage in the off-states.

In this state, with the MOS transistor 11 turning on, VREF+ is applied from the high potential terminal H to the output terminal 10a. Since the MOS transistor 14 is in the off-state, VREF− is not outputted. Since the MOS transistor 12 is also in the on-state at this time, the Intermediate potential VCM (1.5V) Is being applied from the Intermediate potential terminal M to the source of the n-type MOS transistor 13 of low threshold voltage through the MOS transistor 12 and the high potential VREF+ (3.0V) is being applied from the output terminal 10a to the drain of the n-type MOS transistor 13 of low threshold voltage. Since the gate of the MOS transistor 13 maintains the off-state, it is maintained at 0V. Since a gate-source voltage of the n-type MOS transistor 13 of low threshold voltage is thus −1.5V and a substrate bias effect appears additionally, the off-state can be maintained surely and a leak current does not flow even when the threshold voltage is low.

Next, the control circuit 16 controls the D/A conversion circuit 1 as shown in FIG. 3B, when the intermediate potential VCM is to be outputted. That is, the control circuit 16 turns on the p-type MOS transistor 12 of low threshold voltage and the n-type MOS transistor 13 of low threshold voltage to the on-states and maintains the p-type MOS transistor 11 and the n-type MOS transistor 14 in the off-states.

In this state, with the MOS transistors 12 and 13 turning on, the Intermediate potential VCM is applied from the Intermediate potential terminal M to the output terminal 10a. Since the MOS transistors 11 and 14 are in the off-states, none of the high potential VREF+ and the low potential VREF− are outputted.

Next, the control circuit 16 controls the D/A conversion circuit 1 as shown in FIG. 3C, when the low potential VREF− is to be outputted. That is, the control circuit 16 turns on the n-type MOS transistor 14 and the n-type MOS transistor 13 of low threshold voltage to the on-states and maintains the p-type MOS transistor 11 and the p-type MOS transistor 12 of low threshold voltage in the off-states.

In this state, with the MOS transistor 14 turning on, the low potential VREF− is applied from the low potential terminal L to the output terminal 10a. Since the MOS transistor 11 is in the off-state, the high potential VREF+ is not outputted. Since the MOS transistor 13 is also being turned on at this time, the intermediate potential VCM (1.5V) is applied from the intermediate potential terminal M to the source of the p-type MOS transistor 12 of low threshold voltage and the low potential VREF− (0V) is applied from the output terminal 10a to the drain of the p-type MOS transistor 12. Since the gate of the MOS transistor 12 maintains the off-state, it is maintained at 0V. As a result, the gate-source voltage of the p-type MOS transistor 13 of low threshold voltage is thus 1.5V and the substrate bias effect appears additionally. Thus, the off-state of the MOS transistor 13 can be maintained surely and the leak current does not flow even when the threshold voltage is low.

As described above, since the control circuit 16 controls to turn on and off each of the MOS transistors 11 to 14, the MOS transistor in the off-state is prevented from allowing the leak current to flow in any cases of outputting three state outputs, that is, the high potential VREF, the intermediate potential VCM and the low potential VREF−.

As a result, by connecting in series the p-type MOS transistor 12 and the n-type MOS transistor 13, which are of low threshold voltages, it is possible to output the voltages of high potential, intermediate potential and low potential accurately with a minimum number of transistors.

Further, the Intermediate potential VCM is outputted by turning on the MOS transistors 12 and 13 of low threshold voltages simultaneously. The other potentials are outputted by turning on one of the MOS transistors 12 and 13 and turning off the other of the MOS transistors 12 and 13. In this case, the gate bias between the source-gate in the off-state can be made negative. As a result, the off-state can be maintained surely without generation of the leak current.

In the first embodiment described above, the series circuit of the MOS transistors 12 and 13 of low threshold voltages, which are provided in the output stage of the Intermediate potential VCM, has the n-type MOS transistor 13 at an output side, that is, at the capacitor 10 side. This arrangement provides the following advantage.

That is, for setting on-resistances of a p-type MOS transistor and an n-type MOS transistor, an area of the p-type MOS transistor is occasionally enlarged. For this reason, a drain capacitance, which is a parasitic capacitance, of the p-type MOS transistor tends to increase relative to the n-type MOS transistor. As a result, since the n-type MOS transistor 13 is arranged at the capacitor 10 side, time for charging the capacitor 10 for outputting the high potential VREF+, for example, can be shortened and the switching speed can be increased relative to a case that the p-type MOS transistor 12 is provided at the capacitor 10 side. Thus, in a case that the switching speed need be improved with priority, it is preferred to arrange the n-type MOS transistor 13 of low threshold voltage at the capacitor 10 side as exemplified in the first embodiment.

Second Embodiment

Figure 4:
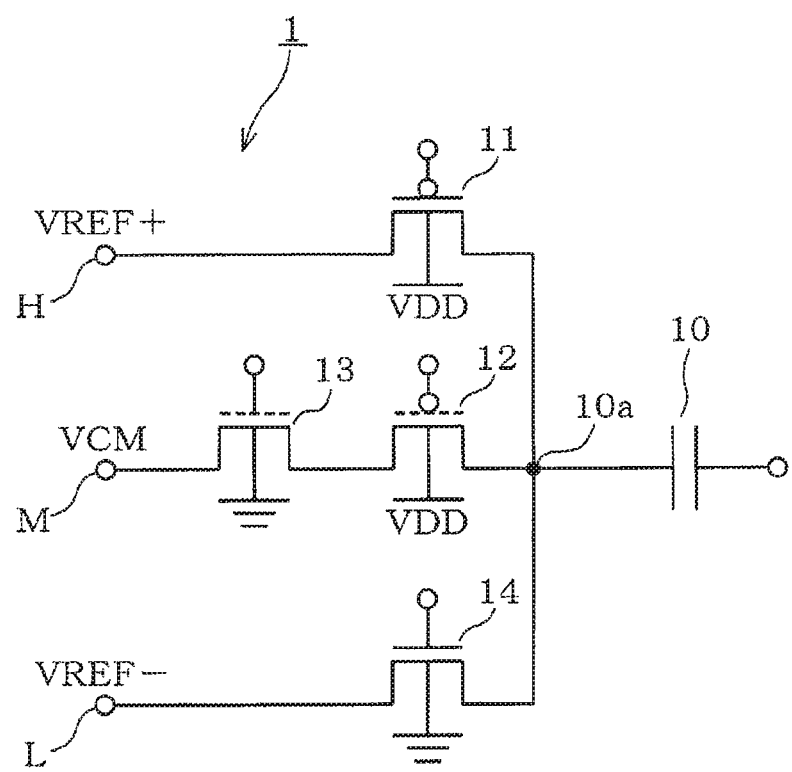
FIG. 4 is an electric circuit diagram showing a second embodiment.

A second embodiment is configured as shown in FIG. 4. The second embodiment is different from the first embodiment in that the positional arrangement of the MOS transistors 12 and 13 of low threshold voltages provided in a path from the intermediate potential terminal M side to the output terminal 1a is reversed. That is, the p-type MOS transistor 12 of low threshold voltage is arranged at the output terminal 10a side. According to this configuration, the operational conditions are the same as in the first embodiment. As a result, similar operation and advantage are provided even in the configuration of the reversed positional arrangement of the MOS transistors 12 and 13.

Third Embodiment

A third embodiment is configured as shown in FIG. 5A and FIG. 5B. The third embodiment is different from the first embodiment as follows.

In one configuration shown in FIG. 5A, plural intermediate potential terminals Ma and the like are provided in addition to the intermediate potential terminal M. These plural terminals are provided for a case, in which plural intermediate potentials VCM, VCMa and the like are used. To the intermediate potential terminals Ma and the like, MOS transistors 12a, 13a and the like of low threshold voltages, which correspond to the MOS transistors 12 and 13 of low threshold voltages, are connected as intermediate potential switches, respectively. As a result, the similar operation and advantage are provided even in the configuration of two or more sets of the intermediate potential terminals and the intermediate potential switches.

Further, similar operation and advantage are provided even in another configuration, in which two or more sets of at least one of the high potential terminal H, intermediate potential terminal M and low potential terminal L and corresponding potential switches are provided as shown in FIG. 5B. For example, in addition to the configuration of FIG. 5A, plural high potential terminals Ha and the like are provided in addition to the high potential terminal H and plural low potential terminals La and the like are provided in addition to the low potential terminal L. This configuration is for using the high potential terminals Ha and the like for the high potential VREF+a and the like, the low potential terminals La and the like for the low potential VREF−a and the like, respectively. To the high potential terminal Ha, a MOS transistor 11a, which corresponds to the MOS transistor 11, is connected as a high potential switch. To the low potential terminal La, a MOS transistor 14a, which corresponds to the MOS transistor 14, is connected as a low potential switch.

Other Embodiment

The D/A conversion circuit 1 is not limited to the disclosed embodiments but may be implemented differently.

The threshold voltages of the p-type MOS transistor 11 and n-type MOS transistor 14, the threshold voltages of the p-type MOS transistor 12 and n-type MOS transistor 13 of low threshold voltages may be set to arbitrary voltages as far as the threshold voltage of the p-type MOS transistor 12 is lower than that of the p-type MOS transistor 11 and the threshold voltage of the n-type MOS transistor 13 is lower than that of the n-type MOS transistor 14.

Further, the high potential VREF+, intermediate potential VCM and low potential VREF− may be set to arbitrary voltages as far as the high potential VREF+ is higher than the intermediate potential VCM and the low potential VREF− is lower than the Intermediate potential VCM.

The capacitor 10 may be removed.

The embodiments described above are exemplified as used in the primary ΔΣ-type A/D conversion circuit 1. The embodiments may be used in secondary or higher-order ΔΣ-type A/D conversion circuit, other oversampling-type A/D conversion circuits and feedback circuits of A/D conversion circuits of cyclic-type such as Nyquist-type. In addition, the embodiments may be used as a D/A conversion circuit in circuits other than the A/D conversion circuit.

The invention claimed is:

1. A D/A conversion circuit comprising:
a low potential switch, an intermediate potential switch and a high potential switch for selecting one of potentials of a low potential terminal, an intermediate potential terminal and a high potential terminal in response to a control signal, respectively, and outputting a selected potential to an output terminal, wherein:
the high potential switch includes a first p-type MOS transistor connected between the high potential terminal and the output terminal;
the low potential switch includes a first n-type MOS transistor connected between the low potential terminal and the output terminal; and
the intermediate potential switch is connected between the intermediate potential terminal and the output terminal and includes a series circuit of a second p-type MOS transistor, which has a threshold voltage lower than that of the first p-type MOS transistor, and a second n-type MOS transistor, which has a threshold voltage lower than that of the first n-type MOS transistor.

2. The D/A conversion circuit according to claim 1, wherein:
the second n-type MOS transistor is connected at a side of the output terminal in the intermediate potential switch.

3. The D/A conversion circuit according to claim 1, wherein:
the second p-type MOS transistor is connected at a side of the output terminal in the intermediate potential switch.

4. The D/A conversion circuit according to claim 1, further comprising:

a control circuit for controlling the low potential switch, the high potential switch and the intermediate potential switch, wherein;

the control circuit turns on the first p-type MOS transistor and the second p-type MOS transistor and turns off the first n-type MOS transistor and the second n-type MOS transistor, when the high potential is to be outputted, the control circuit turns on the second p-type MOS transistor and the second n-type MOS transistor and turns off the first p-type MOS transistor and the first n-type MOS transistor, when the intermediate potential is to be outputted, and the control circuit turns on the first n-type MOS transistor and the second n-type MOS transistor and turns off the first p-type MOS transistor and the second p-type MOS transistor, when the low potential is to be outputted.

5. The D/A conversion circuit according to claim 1, wherein:

the output terminal is connected to an input side of an A/D conversion circuit, which is an oversampling-type including a ΔΣ-type or a Nyquist-type including a cyclic-type.

6. The D/A conversion circuit according to claim 1, wherein:

at least one of the high potential switch, the intermediate potential switch and the low potential switch includes plural sets of at least one MOS transistor.

7. The D/A conversion circuit according to claim 6, wherein:

only the intermediate potential switch includes plural sets of a series circuit of the second p-type MOS transistor and the second n-type MOS transistor, the series circuit being connected to the output terminal in parallel relation.

8. The D/A conversion circuit according to claim 7, wherein:

the high potential switch includes plural first p-type MOS transistors connected to the output terminal in parallel.

9. The D/A conversion circuit according to claim 7, wherein:

the low potential switch includes plural first n-type MOS transistors connected to the output terminal in parallel.

* * * * *